United States Patent
Pequignot et al.

(10) Patent No.: US 7,138,701 B2
(45) Date of Patent: Nov. 21, 2006

(54) ELECTROSTATIC DISCHARGE PROTECTION NETWORKS FOR TRIPLE WELL SEMICONDUCTOR DEVICES

(75) Inventors: James P. Pequignot, Essex Junction, VT (US); Jeffrey H. Sloan, Richmond, VT (US); Douglas W. Stout, Milton, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 10/605,483

(22) Filed: Oct. 2, 2003

(65) Prior Publication Data

US 2005/0073006 A1 Apr. 7, 2005

(51) Int. Cl.
*H01L 29/00* (2006.01)
*H01L 23/62* (2006.01)

(52) U.S. Cl. ............ 257/546; 257/544; 257/355; 257/173

(58) Field of Classification Search .......... 257/46, 257/104, 173, 355, 544, 546, 653
See application file for complete search history.

(56) References Cited

U.S. PATENT DOCUMENTS

| | | | | |
|---|---|---|---|---|
| 4,670,669 A | * | 6/1987 | Cottrell et al. ............ 327/536 |
| 5,264,874 A | * | 11/1993 | Matsumoto et al. ........ 347/59 |
| 5,679,587 A | * | 10/1997 | Zambrano .................. 438/335 |
| 5,776,807 A | | 7/1998 | Ronkainen et al. |
| 5,798,560 A | * | 8/1998 | Ohkawa et al. ............ 257/555 |
| 5,821,572 A | | 10/1998 | Walker et al. |
| 5,882,967 A | | 3/1999 | Brown et al. |
| 5,939,767 A | | 8/1999 | Brown et al. |
| 6,218,704 B1 | | 4/2001 | Brown et al. |
| 6,242,793 B1 | | 6/2001 | Colombo et al. |
| 6,266,222 B1 | | 7/2001 | Colombo et al. |
| 6,309,921 B1 | | 10/2001 | Ema et al. |
| 6,329,694 B1 | | 12/2001 | Lee et al. |
| 6,399,990 B1 | * | 6/2002 | Brennan et al. ........... 257/355 |
| 6,590,273 B1 | * | 7/2003 | Okawa et al. ............. 257/544 |
| 6,891,207 B1 | * | 5/2005 | Pequignot et al. ........ 257/173 |

* cited by examiner

*Primary Examiner*—Nathan J. Flynn
*Assistant Examiner*—Victor A. Mandala, Jr.
(74) *Attorney, Agent, or Firm*—W. Riyon Harding; Richard A. Henkler

(57) ABSTRACT

An electrostatic discharge protection network that uses triple well semiconductor devices either singularly or in a series configuration. The semiconductor devices are preferably in diode junction type configuration.

2 Claims, 9 Drawing Sheets

ELECTROSTATIC DISCHARGE PROTECTION NETWORKS FOR TRIPLE WELL SEMICONDUCTOR DEVICES

BACKGROUND OF INVENTION

1. Field of the Invention

The present invention generally relates to electrostatic discharge (ESD) protection circuits and, more particularly, to ESD protection circuits using triple well semiconductor devices residing in an integrated circuit.

2. Description of the Related Art

As electronic components are getting smaller and smaller along with the internal structures in integrated circuits, it is getting easier to either completely destroy or otherwise impair electronic components. In particular, many integrated circuits are highly susceptible to damage from the discharge of static electricity. Electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry. Device failures are not always immediately catastrophic. Often the device is only slightly weakened but is less able to withstand normal operating stresses and, hence, may result in a reliability problem. Therefore, various ESD protection circuits must be included in the device to protect the various components. Multiple considerations are taken into account during the design of such ESD protection circuits.

With system-on-a-chip (SOC), advanced CMOS and high level integration, different circuit and system functions are integrated into a common chip substrate. The industry has expended considerable efforts to prevent noise created by one circuit from infecting another circuit. The industry has used triple well technology to help provide this noise isolation. Unfortunately, with the introduction of triple well technology, several problems must be addressed with respect to ESD networks.

CMOS technology traditionally provided single well or double well isolation. In single well technology, an n-well was placed in a p-type substrate. In dual well technology, a p-well was placed in a p-type substrate as well. For both single and double well, the ESD protection networks were kept the same since the transition from single well to double well did not alter the electrical connections needed for either MOSFET-based ESD protection or diode-based ESD protection networks. The first problem results from the transition from single- or dual-well technology to a triple well technology. The triple well technology requires a region which electrically isolates both the p-well and the n-well from the substrate.

Another problem arises when mixed voltage applications are used. Mixed voltage applications are where the peripheral power supply voltage is different from the native core voltage power, or the input pad voltage exceeds the native core voltage power supply. Mixed voltage applications require unique ESD networks that don't turn on below the applied voltage condition. In triple well technology, this is a concern since structures must be able to be biased without inadvertent turn-on during the functional regime. ESD networks in a mixed voltage environment may not be able to use MOSFET structures due to electrical overstress of the MOSFET transistor. MOSFET electrical overstress occurs above the native power supply condition due to dielectric overstress.

It would, therefore, be a distinct advantage to have a triple well technology ESD network that could overcome the above noted problems. The present invention provides such an ESD network.

SUMMARY OF INVENTION

An electrostatic discharge protection network that uses triple well semiconductor devices either singularly or in a series configuration. The semiconductor devices are preferably in diode junction type configuration.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

Figure 1:
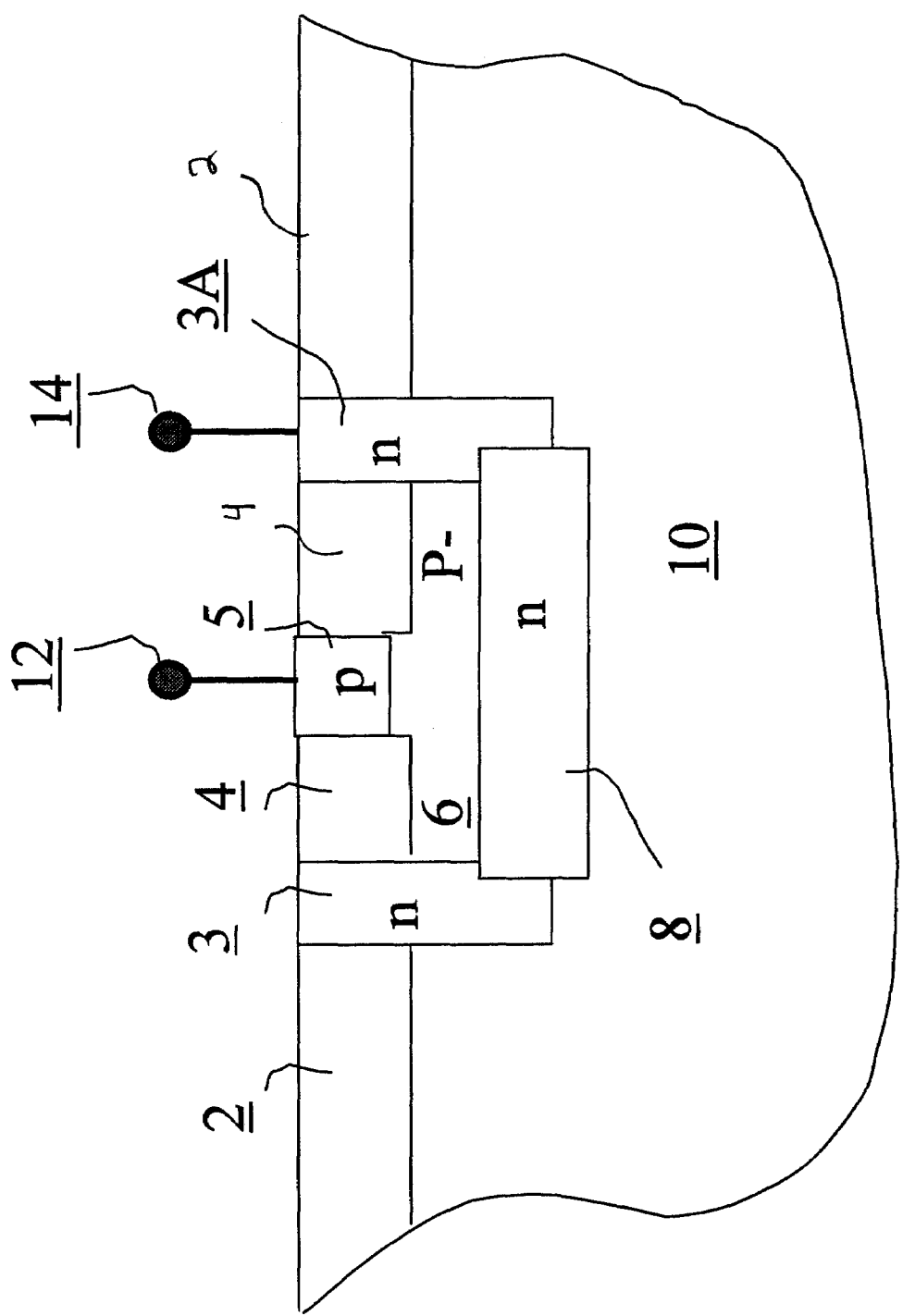
FIG. 1 is a cross sectional diagram illustrating a triple well ESD structure according to the teachings of a preferred embodiment of the present invention.

Referring now to the drawings, and more particularly to FIG. 1, a cross sectional diagram is shown illustrating a triple well ESD structure according to the teachings of a preferred embodiment of the present invention. More specifically, the ESD structure includes an insulator region 2 defining n doped regions 3 and 3A, an insulator region 4 defining a p doped region 5, a p-doped region 6, n doped region 8, and contacts 12 and 14. Regions 2 and 4 can be, for example, a shallow trench isolation (STI) region.

In the preferred embodiment, regions 3 and 3A are n doped and extend down to n doped region 8, and form a ring so as to isolate the p– doped region 6 from the substrate region 10. Regions 3 and 3A can be, for example, an n well implant, a reach-though implant or any other known doping process that allows the dopants to extend below insulation region 2 and connection to n doped region 8. Although not shown, regions 3 and 3A can have insulation in the other dimension leading to the isolation of region 6. In addition, regions 3 and 3A can be formed using a single implant or a plurality of implants of different energies or doses.

Region 6 is p– doped to allow isolation from the substrate region 10. In this embodiment, a p-n diode metallurgical junction is formed where the p– region 6 abuts region 3, region 3A and region 8. This metallurgical junction in this embodiment forms a diode for the application of the ESD protection.

The anode structure of the p-n diode is formed using regions 5 and 6 where region 5 typically has a higher doping concentration as compared to region 6 so that region 5 forms a contact for electrical connection 12. The anode region can be electrically connected to an input pad of a circuit to provide ESD protection.

The cathode structure of the p-n diode is formed from regions 3, 3A, and region 8. Electrical connection to the cathode is established by electrical connection 14. The cathode structure can be connected to a VDD power supply at electrical connection 14 to provide ESD discharge current flow to the VDD power supply. The metallurgical junction formed between region 3, 3A and region 8 and the substrate 10 also forms a second p-n junction which can be used for ESD protection. Connecting regions 3, 3A and 8 to an input pad via electrical connection 14 and grounding the chip substrate region 10, an ESD diode can be established for negative electrical discharges.

Figure 2:
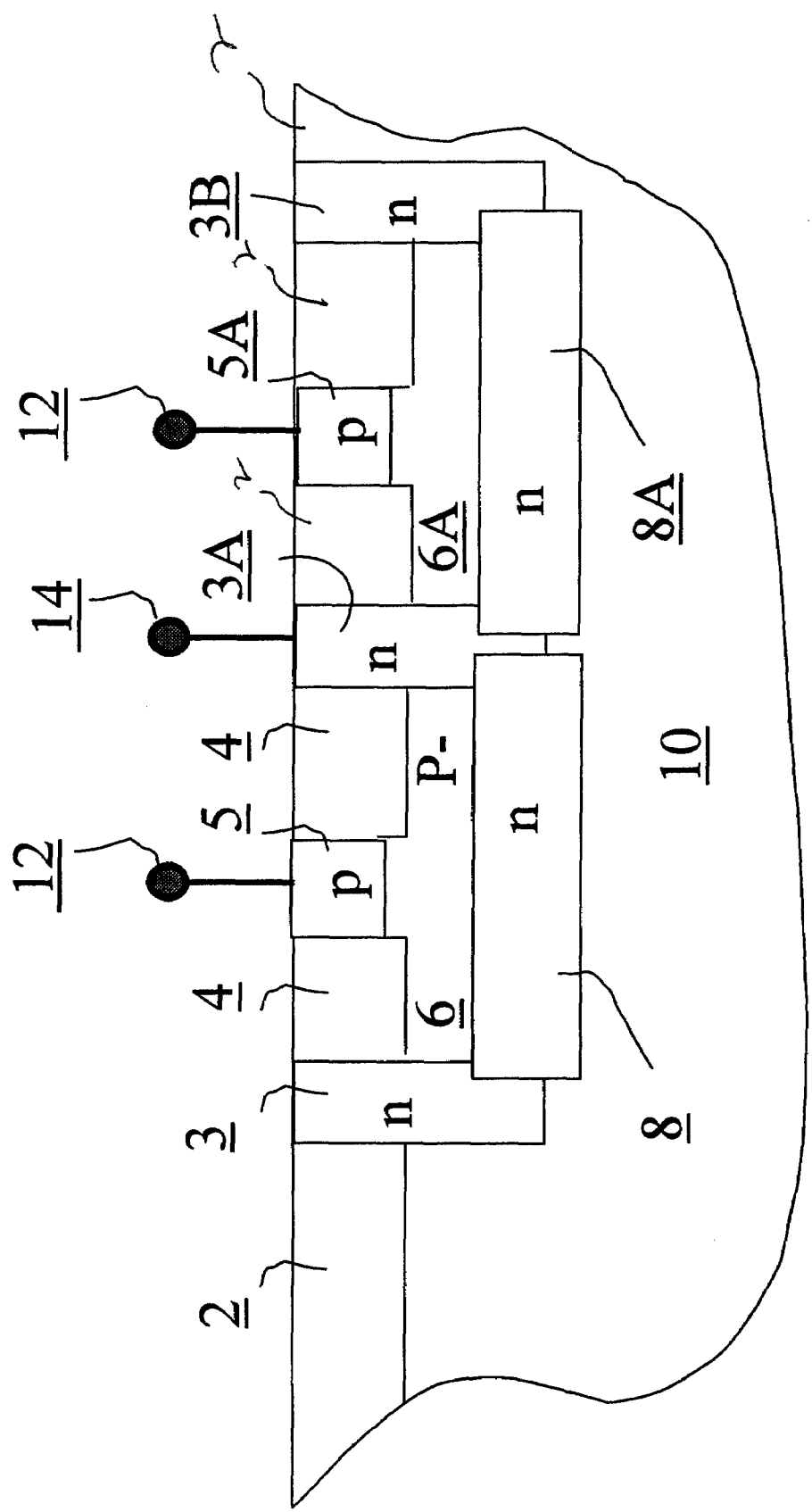
FIG. 2 is a cross sectional diagram illustrating a second preferred embodiment for a triple well diode according to the teachings of the present invention.

Reference now being made to FIG. 2, a cross sectional diagram is shown of a second preferred embodiment for a triple well diode according to the teachings of the present invention. FIG. 2 is similar in structure to FIG. 1 with the addition of a plurality of anode structures located within the cathode. More specifically, FIG. 2 represents the diode of FIG. 1 modified to include an additional p+ anode region 5A, p– anode region 6A, n+/n– well region 3B, and lower n band 8A. The advantage of this structure is that the local placement of 3, 3A and 3B allows for a low resistance cathode structure to avoid resistive regions 8 and 8A.

Regions 8 and 8A can be one continuous n-band (not shown) or a plurality of regions which are connected by n+/n– well regions 3, 3A, and 3B. Additionally, this implementation lends itself to a multiple anode structure contained in a common anode region. In this embodiment, the cathode-to-substrate region can also serve as a diode for ESD discharging to the substrate 10. Additionally, the vertical pnp can play a role in the electrical discharge to the substrate formed from the p+/p– emitter, the n-band base and p-substrate collector.

Figure 3:
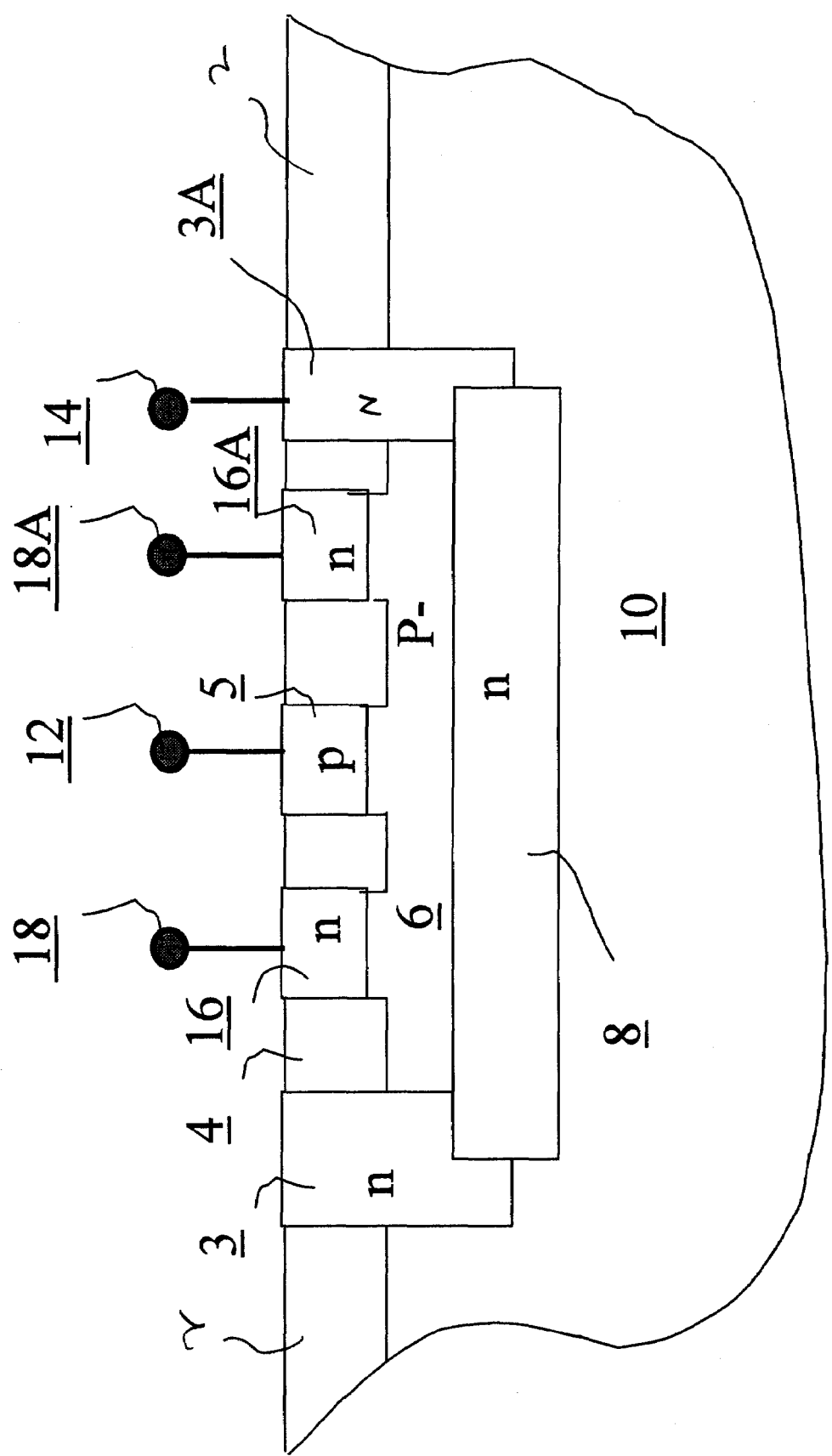
FIG. 3 is a cross sectional diagram illustrating a triple well diode according to the teachings of an alternative preferred embodiment of the present invention.

Reference now being made to FIG. 3, a cross sectional diagram is shown illustrating a triple well diode according to the teachings of an alternative preferred embodiment of the present invention. In this embodiment n+ regions 16 and 16A are defined by isolation regions adjacent to the region 5. Electrical connections 18 and 18A are connected to regions 16 and 16A. Electrical connections 18 and 18A can be the same electrical connection of the well and n-band region 14. In this case, the p-n junction formed between p– region 6 and the n-regions 16 and 16A will provide a lateral current path which is parallel to the p-n junction formed between region 6 and regions 3, 3A and 8. In this embodiment, the capacitance of the structure is higher but allows for lateral discharge of the ESD current from the region 6 to regions 16 and 16A.

In an alternative circuit configuration, electrical connections 18 and 18A can be connected to a second power supply VDD2. In this fashion, the ESD network can be electrically connected from a single input with a discharge path from the input pad to a first and second power supply.

In yet another alternative circuit configuration, the electrical connections 18 and 18A can be connected to an input node, and the electrical connection 12 can be connected to a ground potential. The electrical connection 12 can be at the same potential of substrate region 10 or a second ground potential. In this configuration, the triple well structure can be used for electrical discharge for negative ESD pulses to multiple ground rails from a common input pad connection.

Additionally, the diode structure represented by FIG. 3 can be used as a npn bipolar ESD structure where region 16 and 16A are the emitter, the p-region 6 is the base region, and the n-well/n-band structure 8 can serve as the collector structure. The emitter and collector of the implementation can also be reversed whereas the region 16 and 16A can serve as the collector and the region 8 can serve as the emitter.

In the configuration illustrated in FIG. 3, the n well/n band regions 3, 3A and 8 can be placed to a higher voltage power supply in order to avoid current flow to these regions during overshoot or undershoot operation. It is also possible to allow for the n regions 16 and 16 A to be connected to the higher power supply voltage. In this fashion, undesirable noise injection can be collected at an electrode which does not allow the noise injection to enter a power rail which is to be kept free from noise injection.

The structural layout of FIG. 3 could be modified to include a plurality of p regions 5, and n-regions 16 and 16A could be contained within the region 6. In this fashion, a multi-finger structure can be formed to allow for isolation of the entire structure within regions 3, 3A and 8.

Figure 4:
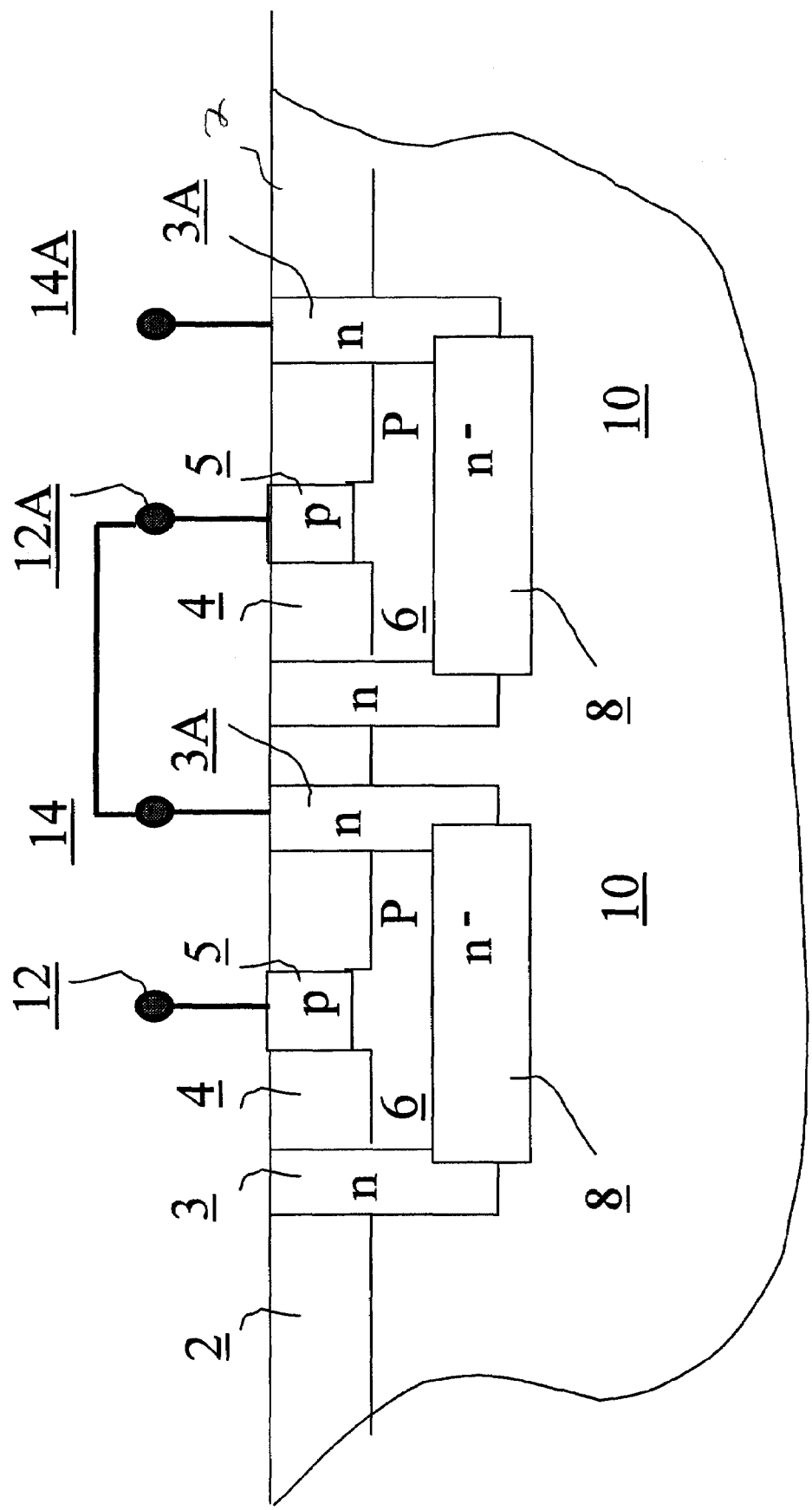
FIG. 4 is a cross sectional diagram illustrating an alternative embodiment of a triple well mixed voltage interface ESD structure formed from the triple well diode elements of FIG. 1 according to the teachings of the present invention.

Reference now being made to FIG. 4, a cross sectional diagram is shown illustrating an alternative embodiment of a triple well mixed voltage interface ESD structure formed from the triple well diode elements of FIG. 1 according to the teachings of the present invention. In this embodiment, each triple well diode structure has their well/n=31 band region spatially separated and independent of the adjacent structure in the substrate region 10. For mixed voltage applications, when an incoming signal is above the native power supply voltage of a product chip, an ESD structure must be designed to allow for the incoming signal to allow forward biasing of a given ESD diode structure. By connecting the diode structures such as those discussed in FIG. 1, FIG. 2, and FIG. 3 in a series manner, forward biasing of the triple well diode element structure can be avoided by forming a plurality of these structures such that the anode of the first structure is connected to the input pad, and whose cathode is connected to a second structure's anode region, ad infinitum. In this fashion, a series of diode structures are connected to prevent forward biasing of the diodes until the input voltage exceeds the turn-on voltage of the series of elements plus the native power supply voltage.

For example, using a diode structure such as that shown in FIG. 1, a series of elements can be put into a series configuration. In this case, the input pad would be connected to electrical connection 12 and whose output is connection 14 for the first triple well diode element. The cathode electrical connection 14 of the first triple well element is connected to a second triple well element anode element 12A. This forms a plurality of elements, where they are all contained within the same substrate region 10. The last triple well diode element 14A is connected to a power supply (e.g. VDD). In this fashion, the isolation structure which is formed from the n well and band regions has the utility as serving as a cathode contained within the triple well mixed voltage ESD network.

Figure 5:
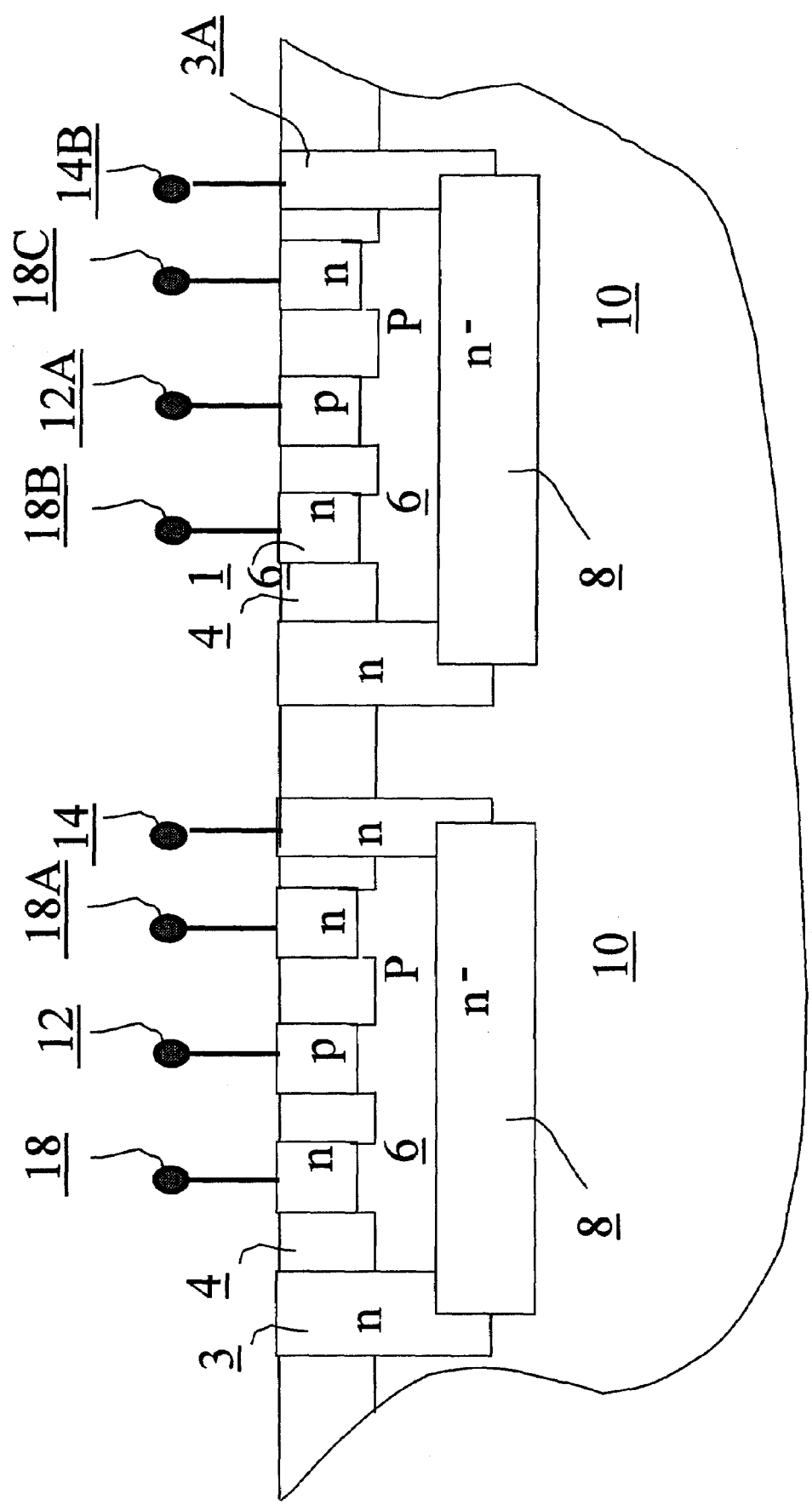
FIG. 5 is a cross sectional diagram illustrating an interface ESD structure formed from triple well diode elements of FIG. 3 according to the teachings of the present invention.

Reference now being made to FIG. 5, a cross sectional diagram is shown illustrating an interface ESD structure formed from triple well diode elements of FIG. 3 according to the teachings of the present invention. Using the diode structure of FIG. 3, a plurality of diode elements can be put into a series configuration where again each n well/n– band region 8 is separated and not abutting the adjacent elements. In this case, the input pad would be connected to electrical connection 12 and whose output is connection 18 and 18A for the first triple well diode element. The output of 18 and 18A are then connected to the anode of the second triple well diode element 12A. In this fashion, the electrical connection 14 can be connected to a high voltage power supply whose voltage is above the input voltage. In this configuration, the n well/n– band structure 8 serves a means of discharge directly to a second power supply instead of through the plurality of triple well diode elements in series. Each triple well diode structure can have an independent electrical connection to a independent power supply or a plurality of power supplies. Given a plurality of triple well diode structures, the independent n-well/n-band regions can be connected to different power supplies different from the power supply connection of the last triple well diode element in the string. The advantage of this implementation is that electrical discharge current can flow to multiple power supplies and noise can be distributed to different supplies.

In an alternative electrical connection, the electrode 14 can be connected to connection 18 and 18A, and 14A can be connected to 18B and 18C allowing parallel discharge paths through the ESD network. In this fashion current flowing from the anode is discharged to both metallurgical junctions. The advantage of this connection is that all the ESD current will flow through the structure.

Figure 6:
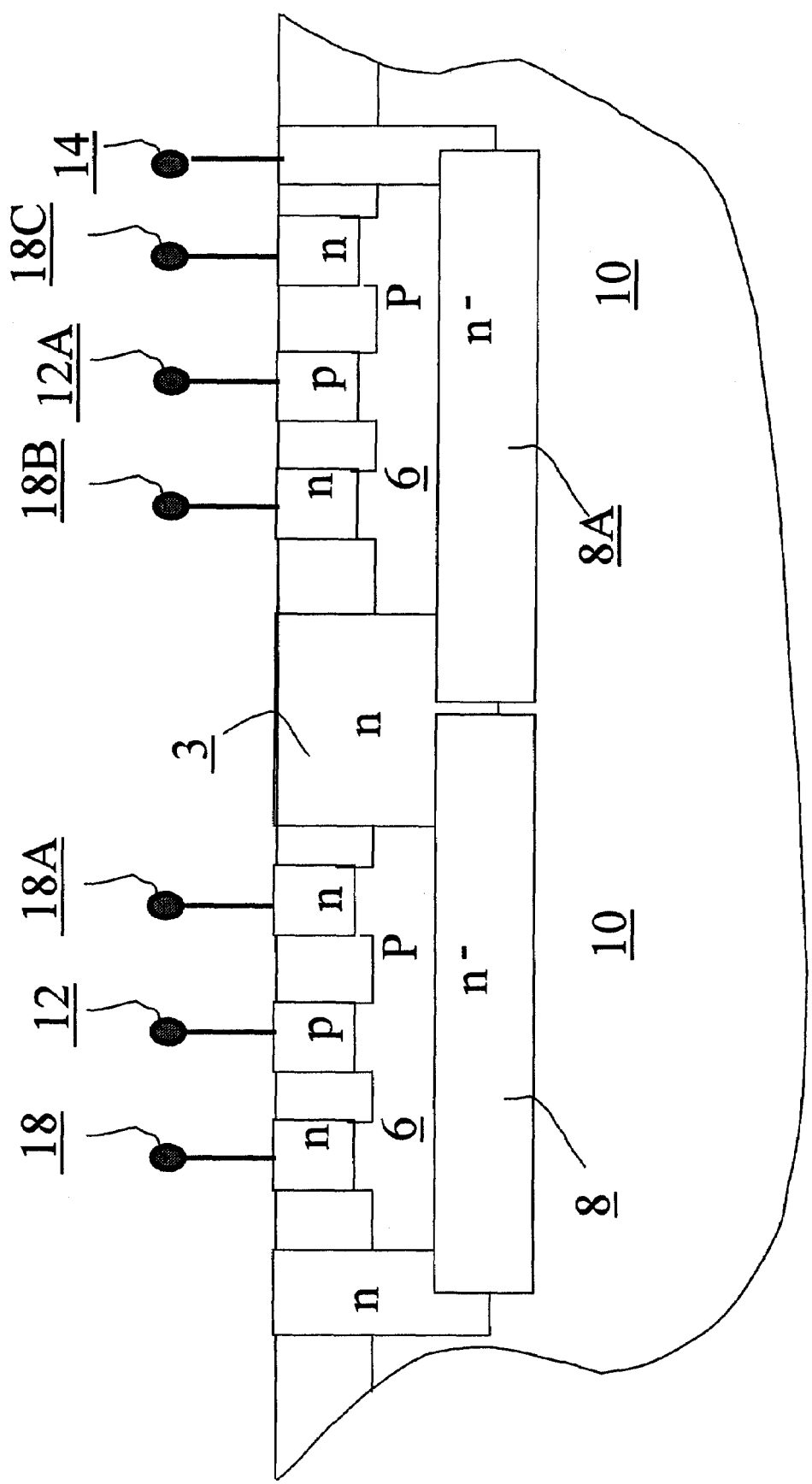
FIG. 6 is a cross sectional diagram illustrating a mixed voltage interface triple well ESD network where the n well/n-band regions are merged as a single region according to the teachings of the present invention.

Reference now being made to FIG. 6, a cross sectional diagram is shown illustrating a mixed voltage interface triple well ESD network where the n well/n– band regions are merged as a single region according to the teachings of the present invention. In this embodiment, the input can be connected to electrical connection 12 serving as an anode region. The cathode is connected to electrical connections 18 and 18A which are connected to the second anode of the second stage 12A. The cathode of the second stage diode is 18B and 18C which are connected to a power supply. The isolation region 14 consisting of the n-well and n-band region cannot be connected to the power supply VDD directly as the current will be one diode voltage from the power supply. This will lead to diode turn-on prior to the mixed voltage condition. The advantage of merging the triple diode successive stages is the density advantage by avoiding the band-to-band isolation rules. Hence, a denser design can be constructed by merging the successive stages.

Figure 7:
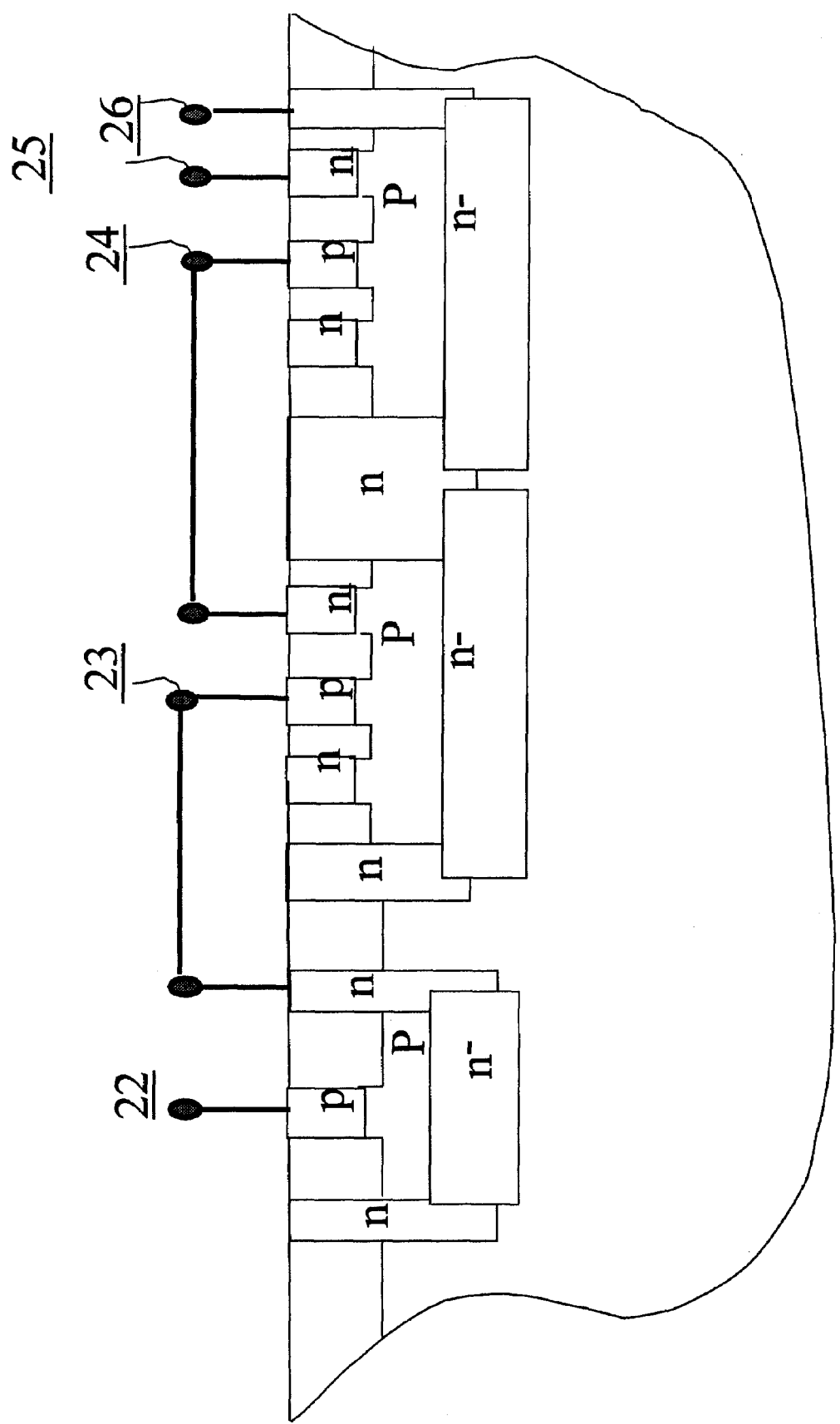
FIG. 7 is a cross sectional diagram illustrating a mixed voltage interface triple well diode ESD network which provides a separate first diode stage followed by a merging of all successive diode stages according to the teachings of the present invention.

Reference now being made to FIG. 7, a cross sectional diagram is shown illustrating a mixed voltage interface triple well diode ESD network which provides a separate first diode stage followed by a merging of all successive diode stages according to the teachings of the present invention. The disadvantage of the embodiment in FIG. 6 is that utilization of the n-well/n-band region for ESD discharge is eliminated and only lateral discharge current paths are provided to the VDD power supply. As a result, a structure which allows discharge to the first triple well diode stage which is independent of the merged isolation band diode regions has both the ESD advantage for the first stage, and the density advantage of all successive stages. Additionally, given a plurality of independent circuits, the successive stages of the triple well diode structure can be shared across circuits for ESD and density advantages. Experimental results have shown a 4× area saving and a 3× ESD improvement in the sharing of successive diode stages. Hence using a diode structure such as those shown in FIGS. 1, 2 and 3 as a first triple well diode stage whose anode is connected to an input pad, and whose cathode is connected to a anode of the merged triple well diode isolation region, as shown in FIG. 6, a new embodiment having the ESD and density advantages are established. The input is connected to electrode 22. The cathode of the first stage is electrical connection 23 which is connected to the anode of the second stage. The cathode of the second stage 24 is connected to the anode of the third stage. The cathode of the third stage 25 is connected to additional stages or a power supply voltage. The n well/n-band region 26 is connected to the same power supply, a reference voltage or an independent power supply.

Figure 8:
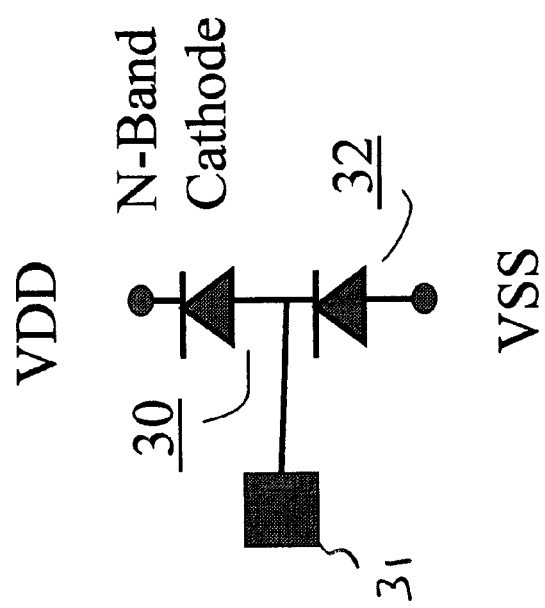
FIG. 8 is a schematic diagram illustrating a circuit implementation of the triple well diode structure of FIG. 1 according to the teachings of the present invention.

Reference now being made to FIG. 8, a schematic diagram is shown illustrating a circuit implementation of the triple well diode structure of FIG. 1 according to the teachings of the present invention. More specifically, two triple well diode structures 30 and 32 as discussed in FIG. 1, are shown. In this embodiment, the anode is a p region 5 and the cathode is a n-band/n well region 8 or other n-doped region 3/3A. The first triple well ESD diode structure 30 has its p/p+ anode 5 connected to an input pad 31, and the cathode 3/3A connected to a power supply VDD. A second triple well ESD diode structure 32 is connected to the input pad 31. In this case the n-band/n-well structure 8 can be connected to the input pad 31, and the substrate is the second electrode. A second orientation is where the input pad 31 is connected to the n-band/n-well structure 8 and the p+ anode region is grounded. In this fashion, ESD current is discharged for negative undershoot or negative pulses.

Figure 9:
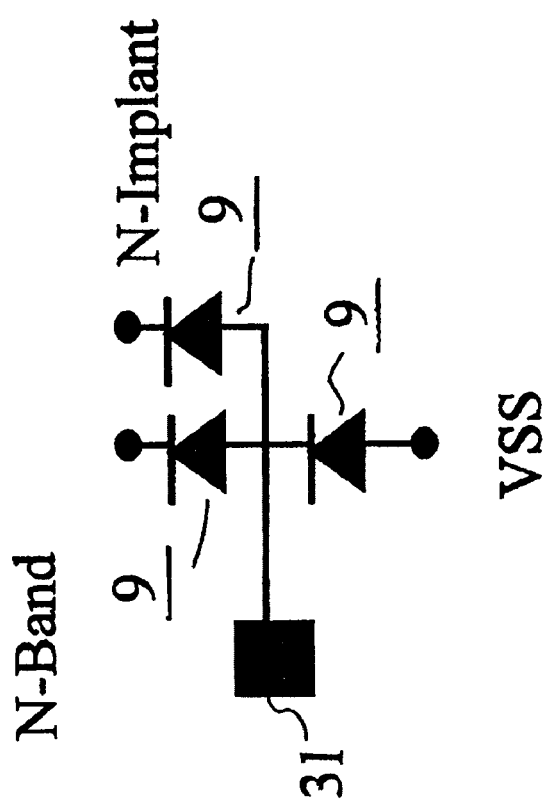
FIG. 9 is a schematic diagram illustrating an electrostatic discharge circuit using the triple well structure of FIG. 3 according to the teachings of the present invention

Reference now being made to FIG. 9, a schematic diagram is shown illustrating an electrostatic discharge circuit using the triple well structure of FIG. 3 according to the teachings of the present invention. In this case two triple well ESD structures 90 and 92 are used. The first triple well ESD diode structure 90 has its p+ anode 5 connected to an input pad 31 and a first cathode and second cathode where the first cathode is the n-band/n-well cathode structure 8 and the second is a n+ implant 3 as shown in FIG. 3. In this fashion, the first or second cathode can be connected to the same or different power supplies. A second triple well ESD diode structure 92 is connected to the input pad 31. In this case, the n-band/n-well structure 8 can be connected to the input pad 31, and the substrate 10 is the second electrode.

A different orientation can be configured where the input pad 31 is connected to the n-band/n-well structure 8, and the p+ anode region 5 is grounded. In this orientation, ESD current is discharged for negative undershoot or negative pulses. Additionally, using the structure in FIG. 3, the n+ diffusion 3 can be connected to the input pad 31, and the isolated p– region 6 can be connected to the substrate 10 or a second ground electrode. In this configuration, a first and second n-region can provide ESD protection for negative ESD pulse events. Additionally, the n+ region can serve as a npn bipolar element where the n+ region is the emitter and the n-band/n-well region 8 serves as a collector.

Various modifications may be made to the structures of the invention as set forth above without departing from the spirit and scope of the present invention as described and claimed. The spirit of the invention would allow for alternative diode and bipolar structures which are present in RF CMOS technology, BiCMOS technology, BiCMOS Silicon Germanium, BiCMOS Silicon Germanium Carbon, and Silicon on Insulator (SOI) technology. In BiCMOS technology, epitaxial regions can be deposited on the silicon surface to provide a p-type anode structure. Using selective epitaxial deposition techniques, silicon anode structures can be formed above the surface as shown in FIG. 1 to FIG. 7. In this fashion, the spirit of the triple well ESD structure can be fulfilled and combined and/or modified to achieve the utility of the present invention. This epitaxial film can contain Silicon, Germanium or Carbon atoms to form the epitaxial region. In the spirit of the present invention, Schottky diodes, Mott diodes, and Zener diodes can be formed for the anode structure to fulfill the utility of the present invention and may be combined and/or modified.

Various aspects of the embodiments described above may be combined and/or modified. In the present invention, the electrical circuits and series configurations can be connected between two power supplies of a common voltage, two power supplies of different voltage, between a ground and power supply rail and between two ground rails. A plurality of these structure can be used in combination and permutation between system power rails or system on a chip design on a common or different substrate.

The invention claimed is:

1. A triple well electrostatic discharge (ESD) network comprising:
   a substrate of a first conductivity;
   an insulator region residing on the surface of the substrate;
   a first region of a second conductivity being partially embedded in the insulator region and the substrate;
   a second region of the second conductivity being completely embedded in the substrate and partially embedded in the first region;
   a third region of the second conductivity being partially embedded in the insulator region, the second region, and the substrate, the third region, second region, and first region forming a cathode coupled to a power supply;
   a fourth region of the first conductivity being embedded in the insulator region and being located between the first and third regions; and
   an isolation region forming a metallurgical junction between the fourth region and the first, second and third regions for the conduction of electrostatic discharee, the fourth region and isolation region forming an anode coupled to an input.

2. A triple well electrostatic discharge (ESD) network comprising:
   a substrate of a first conductivity, the substrate being grounded to form an anode;
   an insulator region residing on the surface of the substrate;
   a first region of a second conductivity being partially embedded in the insulator region and the substrate;
   a second region of the second conductivity being completely embedded in the substrate and partially embedded in the first region;
   a third region of the second conductivity being partially embedded in the insulator region, the second region, and the substrate, the third region, second region, and first region forming a cathode coupled to an input;
   a fourth region of the first conductivity being embedded in the insulator region and being located between the first and third regions; and
   an isolation region forming a metallurgical junction between the fourth region and the first, second and third regions for the conduction of electrostatic discharge, the fourth region and isolation region.

* * * * *